(12) United States Patent
Tsai

(10) Patent No.: US 11,749,872 B2
(45) Date of Patent: Sep. 5, 2023

(54) ELECTRONIC DEVICE INCLUDING PLURAL PHASE SHIFTERS AND PLURAL PATCHES THAT ARE ASSOCIATED WITH A LIQUID CRYSTAL LAYER

(71) Applicant: InnoLux Corporation, Miao-Li County (TW)

(72) Inventor: Tsung-Han Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 451 days.

(21) Appl. No.: 17/000,641

(22) Filed: Aug. 24, 2020

(65) Prior Publication Data

US 2021/0083351 A1   Mar. 18, 2021

(30) Foreign Application Priority Data

Sep. 16, 2019 (CN) .......................... 201910871259.6

(51) Int. Cl.
| | |
|---|---|
| *H01P 1/18* | (2006.01) |
| *G02F 1/1337* | (2006.01) |
| *G02F 1/1333* | (2006.01) |
| *H01Q 3/36* | (2006.01) |

(52) U.S. Cl.
CPC ............ *H01P 1/181* (2013.01); *G02F 1/1337* (2013.01); *G02F 1/133308* (2013.01); *H01P 1/184* (2013.01); *H01Q 3/36* (2013.01); *G02F 2201/121* (2013.01)

(58) Field of Classification Search
CPC . H01P 1/181; H01P 1/18; H01P 1/184; H01Q 3/36
USPC ........................................................ 333/161
See application file for complete search history.

(56) References Cited

U.S. PATENT DOCUMENTS

| | | | |
|---|---|---|---|
| 2016/0261043 A1* | 9/2016 | Sazegar et al. | .......... H01Q 3/24 |
| 2020/0089042 A1 | 3/2020 | Cao et al. | |
| 2020/0243969 A1 | 7/2020 | Fang et al. | |

FOREIGN PATENT DOCUMENTS

| | | |
|---|---|---|
| CN | 106684551 A | 5/2017 |
| CN | 108493592 A | 9/2018 |

* cited by examiner

*Primary Examiner* — Benny T Lee
(74) *Attorney, Agent, or Firm* — McClure, Qualey & Rodack, LLP

(57) ABSTRACT

An electronic device is provided, including: a first substrate, a plurality of phase shifters, a second substrate, a plurality of patches, a common electrode layer, a dielectric layer, and a liquid-crystal layer. The plurality of phase shifters are disposed on the first substrate. The second substrate has an inner side facing the first substrate. The plurality of patches are disposed on the inner side of the second substrate. The dielectric layer is disposed between the common electrode layer and the second substrate and on the plurality of patches. The liquid-crystal layer is disposed between the plurality of phase shifters and the common electrode layer.

6 Claims, 10 Drawing Sheets

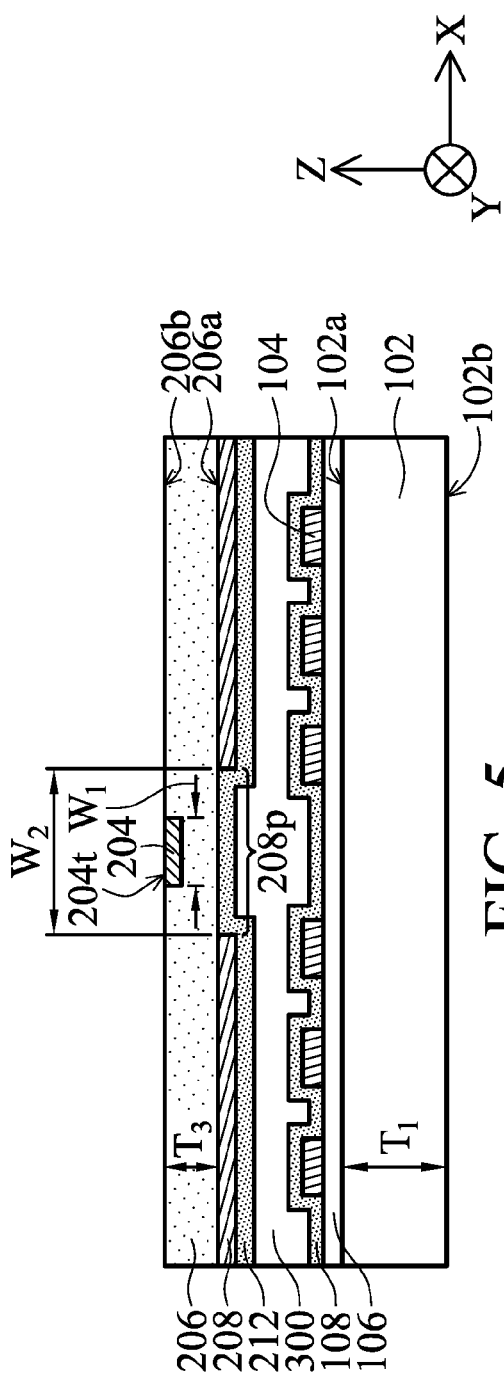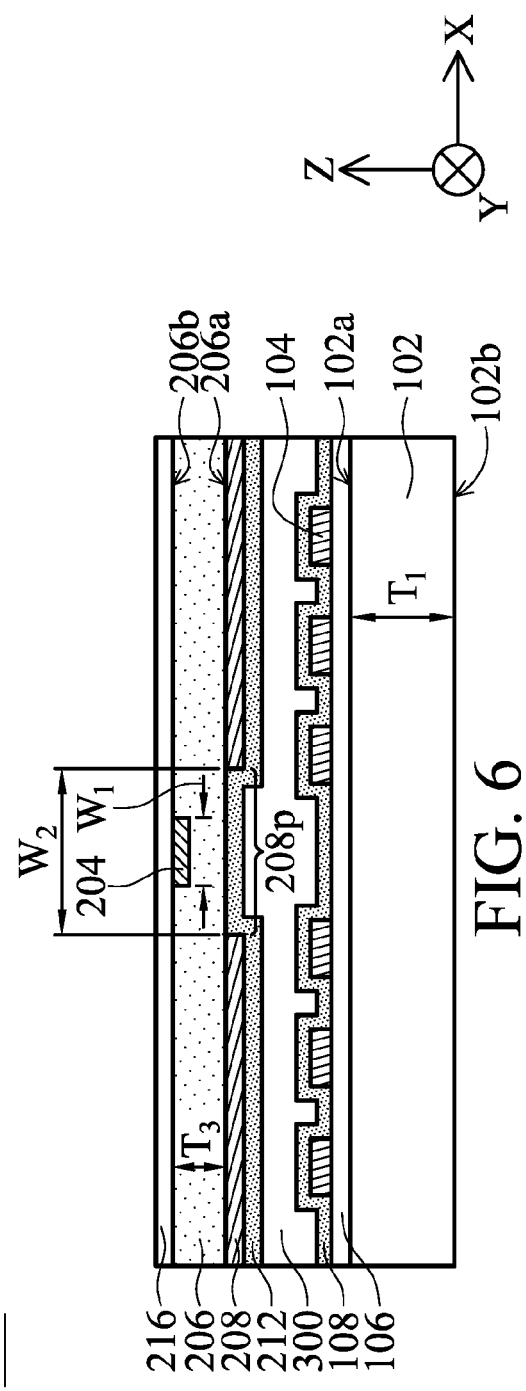

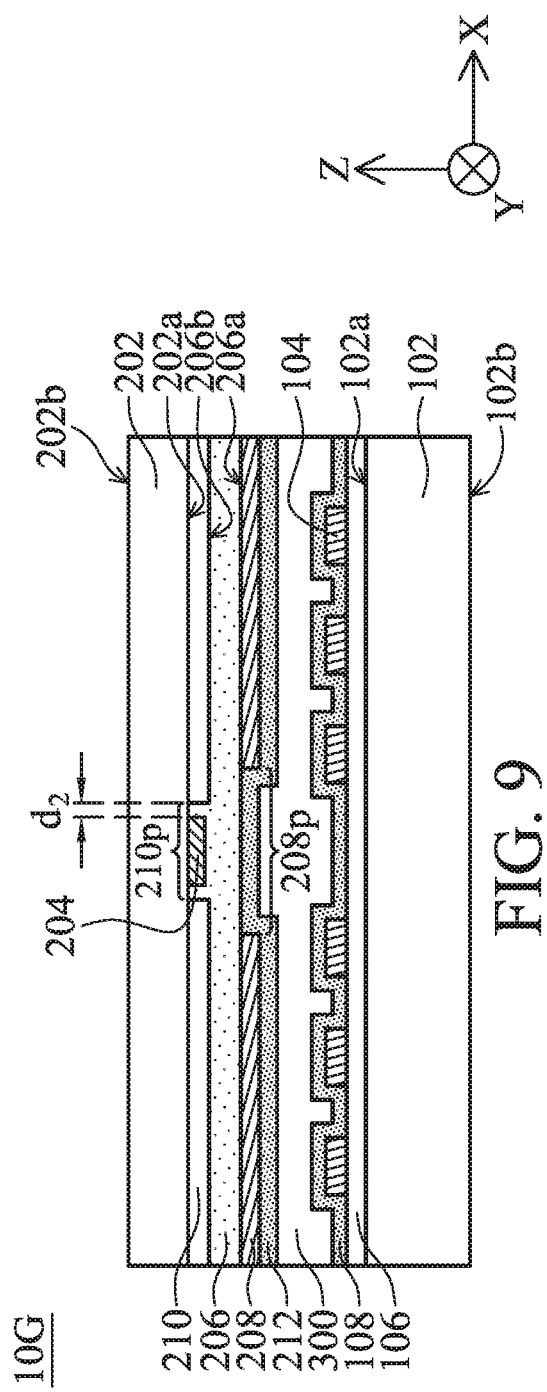
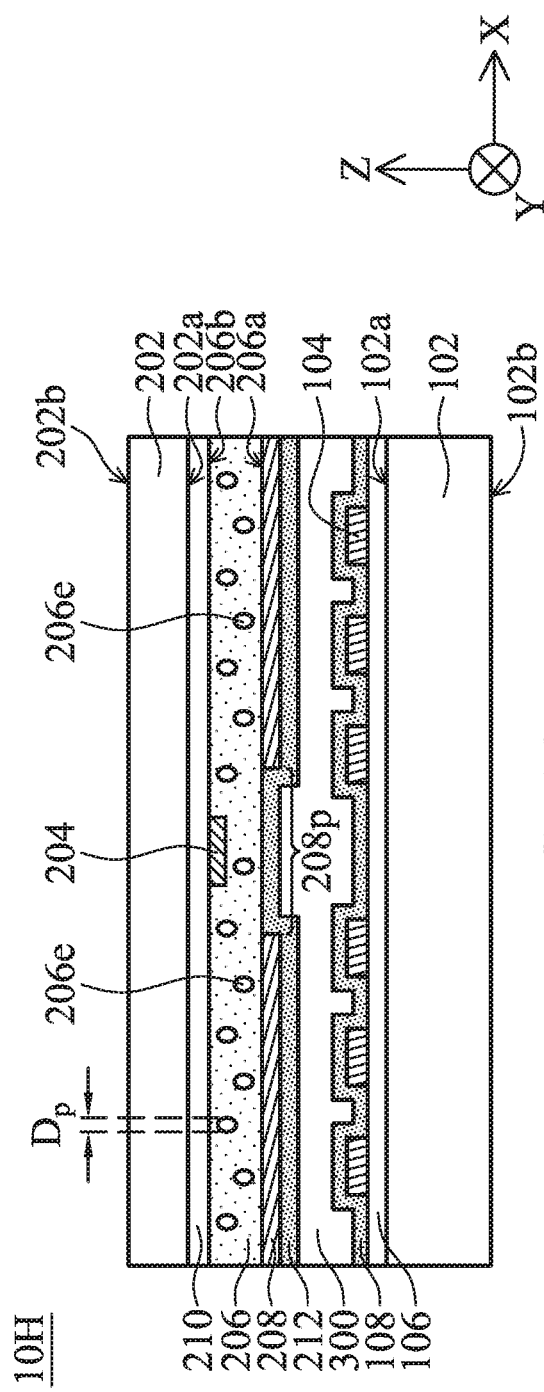

ELECTRONIC DEVICE INCLUDING PLURAL PHASE SHIFTERS AND PLURAL PATCHES THAT ARE ASSOCIATED WITH A LIQUID CRYSTAL LAYER

CROSS REFERENCE TO RELATED APPLICATIONS

This application claims priority of China Patent Application No. 201910871259.6, filed on Sep. 16, 2019, the entirety of which is incorporated by reference herein.

BACKGROUND OF THE INVENTION

Field of the Invention

The present disclosure relates to an electronic device and a method for forming the same, and in particular, to an antenna device and a method for forming the same.

Description of the Related Art

Electronic products have become necessities in modern society. With the flourishing development of these electronic products, consumers have high expectations regarding the quality, functionality, or price.

Some electronic products are further equipped with communication capabilities, such as antenna devices, but they have not been satisfactory in all respects. Therefore, the development of a structural design that can further improve the performance or operational reliability of electronic products or devices is still one of the goals that the industry is currently aiming at.

SUMMARY OF THE INVENTION

An embodiment of the present disclosure provides an electronic device, including: a first substrate; a plurality of phase shifters disposed on the first substrate; a second substrate having an inner side facing the first substrate; a plurality of patches disposed on the inner side of the second substrate; a common electrode layer; a dielectric layer disposed between the common electrode layer and the second substrate and on the plurality of patches; and a liquid-crystal layer disposed between the plurality of phase shifters and the common electrode layer.

To clarify the features or advantages of the present disclosure, a detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 5 shows a cross-sectional view of an electronic device in accordance with some embodiments of the present disclosure.

FIG. 6 shows a cross-sectional view of an electronic device in accordance with some embodiments of the present disclosure.

FIG. 9 shows a cross-sectional view of an electronic device in accordance with some embodiments of the present disclosure.

FIG. 10 shows a cross-sectional view of an electronic device in accordance with some embodiments of the present disclosure.

DETAILED DESCRIPTION OF THE INVENTION

Figure 1:
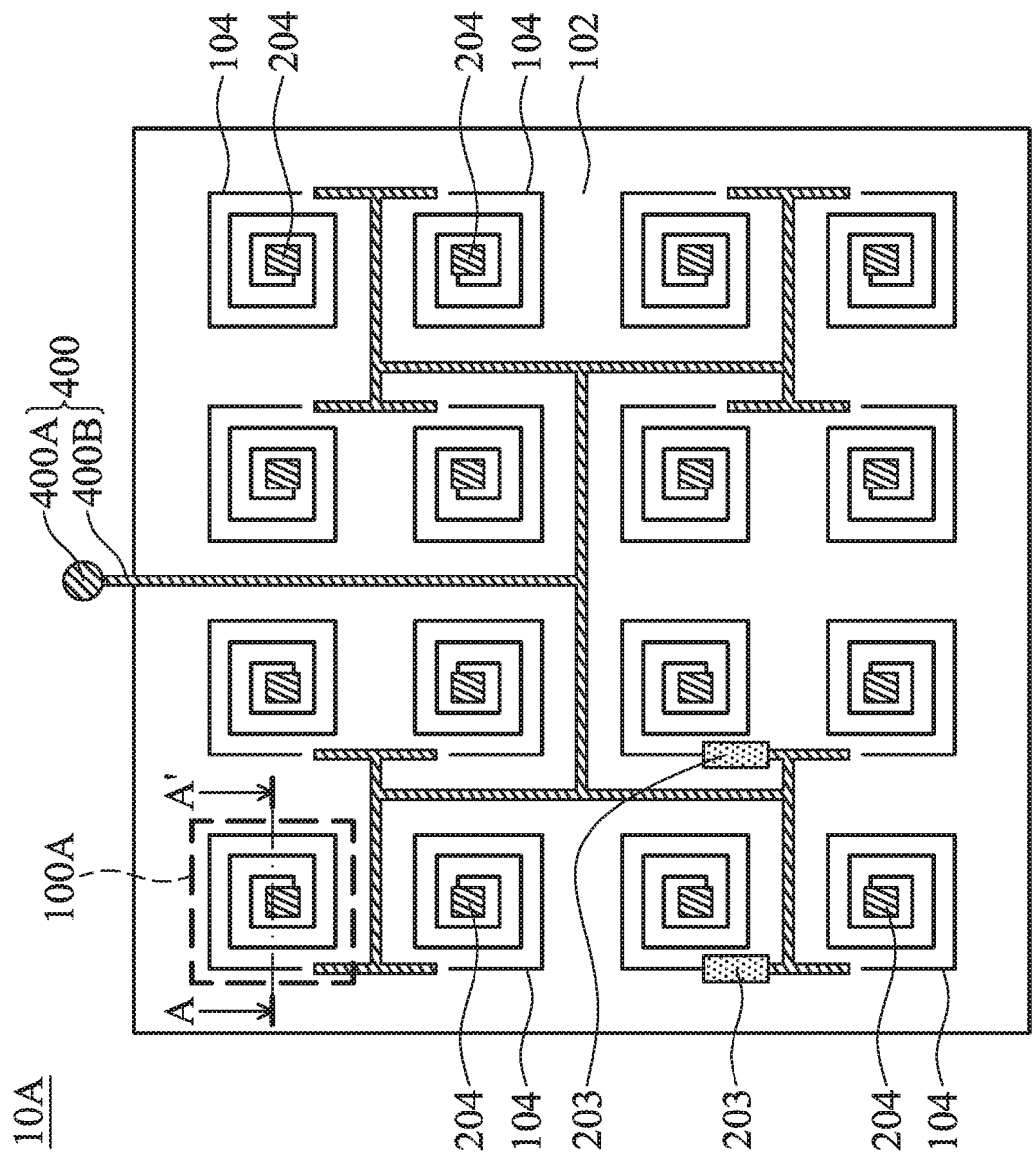
FIG. 1 shows a top view of an electronic device in accordance with some embodiments of the present disclosure.

The electronic device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that the descriptions of the exemplary embodiments are intended to be read in connection with the accompanying drawings, which are to be considered part of the entire written description. The drawings are not drawn to scale. In fact, the size of the element may be arbitrarily enlarged or reduced in order to clearly express the features of the present disclosure.

In addition, the expressions "a first material layer is disposed on or over a second material layer" may indicate the first material layer is in direct contact with the second material layer, or the first material layer is not in direct contact with the second material layer, there being one or more intermediate layers disposed between the first material layer and the second material layer.

It should be understood that, although the terms "first", "second", "third" etc. may be used herein to describe various elements, components, or portions, these elements, components, or portions should not be limited by these terms. These terms are used to distinguish one element, component, or portion from another element, component, or portion. Thus, a first element, component, or portion discussed below could be termed a second element, component, or portion without departing from the teachings of the present disclosure.

The terms "about", "approximately", "substantially", "roughly" typically mean +/−10% of the stated value, or +/−5% of the stated value, or +/−3% of the stated value, or +/−2% of the stated value, or +/−1% of the stated value, or +/−0.5% of the stated value. The stated value of the present disclosure is an approximate value. When there is no specific description, the stated value includes the meaning of "about", "approximately", "substantially", "roughly". Furthermore, the terms "a range from a first value to a second value" and "a range between a first value and a second value" mean that the range includes the first value, the second value, and other values therebetween.

In some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

According to some embodiments of the present disclosure, the provided manufacturing method of an electronic device may form a patch and a common electrode on the same side (single side) of a substrate. Compared with the process of forming metal layers on both sides of the substrate, the provided method may reduce the risk of deterioration of modulation materials or substrate cracks due to the processing temperature, but is not limited thereto. Furthermore, according to some embodiments of the present disclosure, the electronic device formed by the manufacturing method may reduce the dielectric loss of electromagnetic waves or improve operational reliability.

According to some embodiments of the present disclosure, the electronic device may include an antenna device, a liquid-crystal display device, a sensing device, a light emitting device, a tiled device, other suitable devices, or a combination thereof, but is not limited thereto. The electronic device may be a bendable or a flexible electronic device. The antenna device may be, for example, a liquid-crystal antenna, but is not limited thereto. The tiled device may be, for example, a tiled antenna device, but is not limited thereto. It should be understood that the electronic device may be any combination of the devices described above, but the present disclosure is not limited thereto.

Referring to FIG. 1, a top view of an electronic device 10A in accordance with some embodiments of the present disclosure is shown. It should be understood that some elements are omitted for clarity and a portion of the modulation unit 100A of the electronic device 10A is illustrated in FIG. 1 schematically. Furthermore, a portion of the coplanar waveguide 203 is also omitted in FIG. 1, and the coplanar waveguide 203 may overlap one side of the phase shifter 104 (such as one side adjacent to the feeding line 400B) in a normal direction (e.g., the Z direction) of the first substrate 102. In some embodiments, the coplanar waveguide 203 may be partially overlapped with the feeding line 400B. For example, the coplanar waveguide 203 may be disposed on the second substrate 202 (illustrated in FIG. 2), but is not limited thereto. In the present disclosure, unless otherwise specified, "overlap" may include "overlap" and "partially overlap". In different embodiments, the number of the modulation unit 100A of the electronic device 10A can be adjusted based on practical requirements. In addition, it should be understood that additional features may be added to the electronic device 10A described below in accordance with some embodiments. In other embodiments, some features of the electronic device 10A described below may be replaced or omitted.

As shown in FIG. 1, the electronic device 10A may include a first substrate 102 and a plurality of modulation units 100A disposed on the first substrate 102. In some embodiments, the electronic device 10A may be an antenna device, and the modulation unit 100A may be an antenna unit for modulating electromagnetic waves (e.g., radio frequency or microwave).

In some embodiments, the material of first substrate 102 may include glass, quartz, sapphire, ceramic, polyimide (PI), liquid-crystal polymer (LCP) material, polycarbonate (PC), photosensitive polyimide (PSPI), polyethylene terephthalate (PET), other suitable materials, or a combination thereof, but is not limited thereto. In some embodiments, the first substrate 102 may include a printed circuit board (PCB). In some embodiments, the first substrate 102 may include a flexible substrate, a rigid substrate, or a combination thereof.

Furthermore, as shown in FIG. 1, according to some embodiments, the electronic device 10A may include a feeding structure 400, and the feeding structure 400 may be disposed on the first substrate 102 to transmit electromagnetic wave signals. In some embodiments, the feeding structure 400 has a feeding source 400A and a feeding line 400B. The feeding line 400B may be coupled to the feeding source 400A, and feeding source 400A may provide an initial feeding wave. In an embodiment, one feeding line 400B may be coupled to a plurality of feeding sources 400A, but is not limited thereto. In another embodiment, a plurality of feeding lines 400B may be coupled to one feeding source 400A, but is not limited thereto. In some embodiments, the feeding structure 400 has a plurality of feeding sources 400A, the plurality of feeding sources 400A may be coupled to a plurality of feeding lines 400B, but is not limited thereto. In some embodiments, the initial feeding wave may be a high frequency electromagnetic wave, but is not limited thereto. In addition, the feeding structure 400 may be further coupled to a signal processor, a signal modulator, or a combination thereof (not shown) in some embodiments.

In some embodiments, the feeding structure 400 may include a conductive material, such as metal conductive material. In some embodiments, the metal conductive material may include Cu, Ag, Sn, Al, Mo, W, Au, Cr, Ni, Pt, Ti, copper alloy, silver alloy, tin alloy, aluminum alloy, molybdenum alloy, tungsten alloy, gold alloy, chromium alloy, nickel alloy, platinum alloy, titanium alloy, other suitable conductive materials, or a combination thereof, but is not limited thereto.

Figure 2:
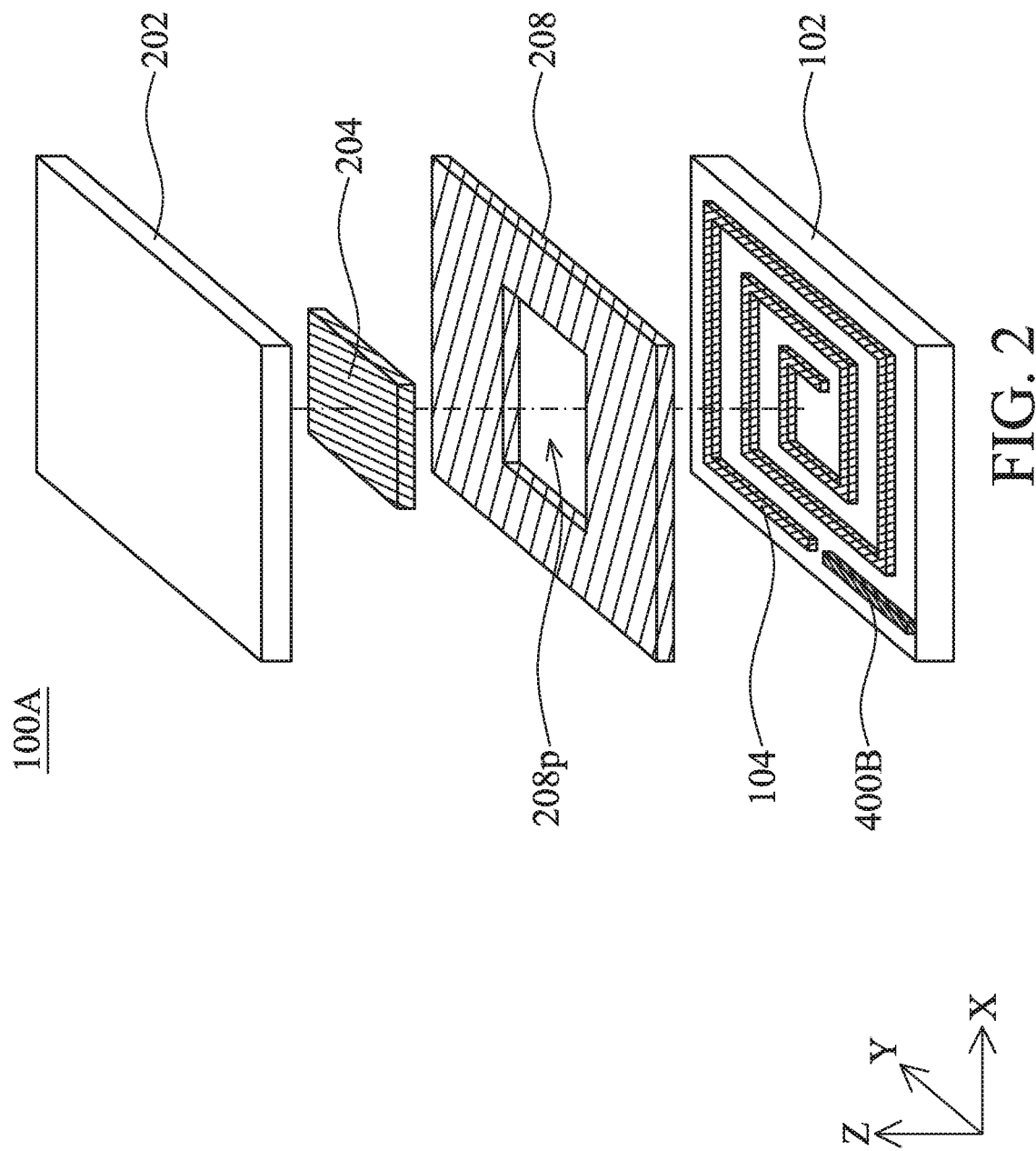
FIG. 2 shows a partial perspective view of an electronic device in accordance with some embodiments of the present disclosure.

In addition, the electronic device 10A may include a plurality of phase shifters 104 (or referred to as a microstrip line), and the phase shifters 104 may be disposed on the first substrate 102. The phase shifters 104 may be adjacent to the feeding structure 400, and the phase shifters 104 may have a spiral shape or a loop shape, but is not limited thereto. At least one of the phase shifters 104 may be used to receive electromagnetic wave signals from the feeding structure 400, for example, through the feeding line 400B, an electromagnetic wave signal may be coupled to a phase shifter 104 in a manner of an induced current by the feeding structure 400 via the coplanar waveguide 203. However, in other embodiments, a phase shifter 104 may also be used to feed out a processed or modulated electromagnetic wave signal, for example, to feed out an electromagnetic wave signal to the feeding line 400B. More specifically, an electric or magnetic field formed between a phase shifter 104 and a common electrode layer 208 (as shown in FIG. 2) may be changed by adjusting the potential of the phase shifter 104 to modulate the refractive index of the modulation material on or around the phase shifter 104, and to further change the phase difference of the passing electromagnetic waves. In another embodiment, an electric or magnetic field formed between a phase shifter 104 and a common electrode layer 208 may be changed by adjusting the potential of the phase shifter 104 to modulate the dielectric coefficient of the modulation material on or around the phase shifter 104, and to further change the capacitance.

In some embodiments, the material of the phase shifter 104 may include a metal conductive material, a transparent conductive material, or a combination thereof. The metal conductive material is similar to the metal conductive material of the feeding structure 400, which will not be repeated here. The transparent conductive material may include a transparent conductive oxide (TCO). For example, the transparent conductive oxide may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials, or a combination thereof, but is not limited thereto.

In addition, the phase shifter 104 may be further electrically connected to a driving element (not shown) according to some embodiments. In some embodiments, the driving element may include an active driving element (e.g., thin film transistor, TFT), a passive driving element, or a combination thereof. Specifically, in some embodiments, the phase shifter 104 may be electrically connected to a thin film transistor, and the thin film transistor may be further electrically connected to a data line and/or a scanning line (gate line). In some embodiments, the phase shifter 104 may be electrically connected to an integrated circuit (IC) and/or a digital to analog converter.

Furthermore, the electronic device 10A may include a patch 204 which may be disposed on the phase shifter 104. In some embodiments, the patch 204 may partially overlap the phase shifter 104 in a normal direction (e.g., Z direction) of the first substrate 102. Further, in some embodiments, the patch 204 may overlap one end of the phase shifter 104 in a normal direction (e.g., Z direction) of the first substrate 102, but is not limited thereto. In another embodiment, the patch 204 may not overlap the end of the phase shifter 104, but overlap other portions of the phase shifter 104. In some embodiments, the patch 204 may be electrically floated, coupled to a given potential (e.g., ground or a DC signal), or other functional circuits, but the present disclosure is not limited thereto.

In some embodiments, the material of the patch 204 may include a metal conductive material, a transparent conductive material, or a combination thereof. The metal conductive material and the transparent conductive material are similar to the material of the phase shifter 104, which will not be repeated here.

Next, FIG. 2 shows a partial perspective view of the electronic device 10A (as shown in FIG. 1) in accordance with some embodiments of the present disclosure. It should be understood that, for clarity, partial elements of the modulation unit 100A in FIG. 1 is illustrated in FIG. 2. As shown in FIG. 2, in some embodiments, the modulation unit 100A may include a first substrate 102, a feeding line 400B and a phase shifter 104 disposed on the first substrate 102. As shown in FIG. 2, in some embodiments, one end of the feeding line 400B may correspond to one end of the phase shifter 104, but the present disclosure is not limited thereto.

Furthermore, in some embodiments, the modulation unit 100A may further include a second substrate 202, a patch 204, and a common electrode layer 208. The second substrate 202 may be disposed opposite to the first substrate 102, and the common electrode layer 208 and the patch 204 may be disposed between the first substrate 102 and the second substrate 202.

In some embodiments, the material of the second substrate 202 may be similar to the material of the first substrate 102, which will not be described here again. In addition, the material of the second substrate 202 may be the same as or different from that of the first substrate 102.

Furthermore, in accordance with some embodiments, both the first substrate 102 and second substrate 202 may be flexible substrates such that the flexibility and the plasticity of the entire electronic device 10A may be improved, which facilitates surface mounting on various articles, for example, cars, motorcycles, airplanes, ships, buildings, or other applicable articles, but the present disclosure is not limited thereto.

Furthermore, as shown in FIG. 2, the common electrode layer 208 may have an opening 208p, and the patch 204 partially overlaps the opening 208p in a normal direction Z of the first substrate 102. In addition, an end of the phase shifter 104 may overlap the opening 208p in some embodiments, but is not limited thereto. According to some embodiments, the capacitance and/or the phase difference may be adjusted by applying different electric fields to the modulation material in the modulation unit 100A (e.g., a liquid-crystal layer 300 in FIGS. 3-10) to control the transmission direction or other parameters of the electromagnetic wave signal passing through the opening 208p and the patch 204. The structure of the electronic device 10A is described below in further detail.

Figure 3:
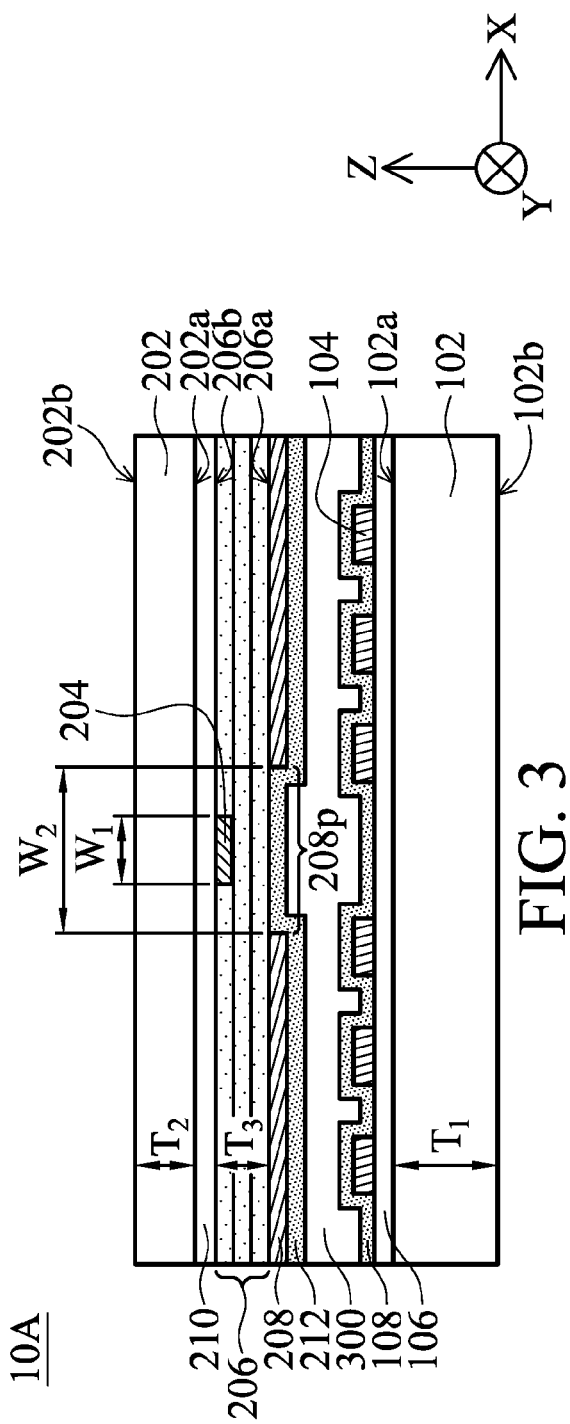
FIG. 3 shows a cross-sectional view of an electronic device in accordance with some embodiments of the present disclosure.

FIG. 3 shows a cross-sectional view of the electronic device 10A in accordance with some embodiments of the present disclosure. Specifically, FIG. 3 illustrates a cross-sectional view of the modulation unit 100A along the section line A-A' in FIG. 1. As described above, the electronic device 10A includes the first substrate 102 and the second substrate 202. In detail, the first substrate 102 is disposed opposite to the second substrate 202. The first substrate 102 has an inner side 102a facing the second substrate 202 and an outer side 102b opposite to the inner side 102a. Similarly, the second substrate 202 has an inner side 202a facing the first substrate 102 and an outer side 202b opposite to the inner side 202a.

Furthermore, the first substrate 102 may have a first thickness $T_1$ and the second substrate 202 may have a second thickness $T_2$. In some embodiments, the first thickness $T_1$ of the first substrate 102 may be greater than or equal to the second thickness $T_2$ of the second substrate 202. It should be noted that the second thickness $T_2$ may be less than the first thickness $T_1$ according to some embodiments. Since the second substrate 202 is the main substrate through which electromagnetic wave signals pass, the dielectric loss of electromagnetic wave signals entering the patch 204 from outside or radiating outwardly from the patch 204 may be reduced.

Moreover, according to some embodiments of present disclosure, "the first thickness $T_1$" of the first substrate 102 and "the second thickness $T_2$" of the second substrate 202 refer to the maximum thickness of the first substrate 102 and the maximum thickness of the second substrate 202 in a normal direction Z of the first substrate 102 respectively.

In addition, in accordance with the embodiments of the present disclosure, an optical microscopy (OM), a scanning electron microscope (SEM), a film thickness profiler ($\alpha$-step), an ellipsometer, or other suitable methods may be used to measure the thickness or width of each element, or distance between the elements. Specifically, in some embodiments, after the liquid-crystal layer 300 is removed, a scanning electron microscope may be used to obtain any cross-sectional image of the structure and measure the thickness or width of each element, or distance between the elements in the image.

As shown in FIG. 2 and FIG. 3, in some embodiments, the phase shifter 104 may be disposed on the inner side 102a (FIG. 3) of the first substrate 102. In some embodiments, the patch 204 may be disposed on the inner side 202a (FIG. 3) of the second substrate 202. As described above, in some embodiments, the patch 204 may overlap the phase shifter 104 in a normal direction Z of the first substrate 102.

Besides, the electronic device 10A may include a dielectric layer 206 (FIG. 3) and a common electrode layer 208 disposed between the first substrate 102 and second substrate 202. As shown in FIG. 3, the dielectric layer 206 may be disposed between the common electrode layer 208 and the second substrate 202, and disposed on the patch 204. For example, the patch 204 may be disposed between the second substrate 202 and the dielectric layer 206. Specifically, the dielectric layer 206 may be disposed adjacent to the second substrate 202, and the dielectric layer 206 has an inner side 206a facing the first substrate 102 and an outer side 206b opposite to the inner side 206a. In some embodiments, the patch 204 may be adjacent to the outer side 206b of the dielectric layer 206, and the common electrode layer 208 may be adjacent to the inner side 206a of the dielectric layer 206. The patch 204 and the common electrode layer 208 may be separated from each other by the dielectric layer 206. In some embodiments, the patch 204 may be surrounded by the dielectric layer 206. In some embodiments, the patch 204 may be disposed in the dielectric layer 206.

In some embodiments, the material of the dielectric layer 206 may include an organic material, an inorganic material, or a combination thereof, but is not limited thereto. In some embodiments, the organic material may include polyimide (PI), polymethylmethacrylate (PMMA), polyethylene terephthalate (PET), liquid-crystal polymer (LCP) material, polyethylene (PE), polyethersulfone (PES), polycarbonate (PC), isoprene, phenol-formaldehyde resin, benzocyclobutene (BCB), perfluorocyclobutane (PECB), other suitable materials, or a combination thereof, but is not limited thereto. In some embodiments, the inorganic material may include silicon oxide, silicon nitride, silicon oxynitride, aluminum oxide, aluminum nitride, aluminum oxynitride, titanium oxide, other suitable materials, or a combination thereof, but is not limited thereto.

As shown in FIG. 3, in some embodiments, the dielectric layer 206 may have a single-layer structure. However, in other embodiments, the dielectric layer 206 may have a multilayer structure. Specifically, according to some embodiments, the number of the multilayer structure of the dielectric layer 206 may range from 2 layers to 50 layers (2≤the number≤50), 2 layers to 40 layers, 3 layers to 30 layers, 4 layers to 20 layers, or 5 layers to 15 layers, such as 6 layers, 7 layers, 8 layers, 9 layers, 10 layers, 11 layers, 12 layers, 13 layers, 14 layers, etc., but is not limited thereto. In some embodiments, each layer of the dielectric layer 206 having a multilayer structure may include same material or different materials, or some layers of the dielectric layer 206 having a multilayer structure may include the same material and the other layers of the dielectric layer 206 having a multilayer structure may include different materials. Furthermore, in some embodiments, the dielectric layer 206 may include at least one polyimide film, but is not limited thereto.

According to some embodiments, the dielectric layer 206 may have a multilayer structure, and the material of the layer closest to the common electrode layer 208 (or the layer in contact with the common electrode layer 208 layer) may include silicon oxide, silicon nitride, other suitable materials, or a combination thereof, but is not limited thereto. In these embodiments, the difference in coefficient of thermal expansion (CTE) between the dielectric layer 206 and the common electrode layer 208 may be reduced, and thereby the warpage problem of the second substrate 202 may be improved.

Furthermore, the dielectric layer 206 may have a third thickness $T_3$. In some embodiments, the third thickness $T_3$ of the dielectric layer 206 may be greater than or equal to 5 μm, and less than or equal to the second thickness $T_2$ of the second substrate 202 (i.e., 5 μm≤third thickness $T_3$≤second thickness $T_2$). In some embodiments, the third thickness $T_3$ of the dielectric layer 206 may be greater than or equal to 0.01 times of the wavelength λ of the electromagnetic wave modulated by the electronic device 10A, and less than or equal to the wavelength λ of the electromagnetic wave modulated by the electronic device 10A (i.e., 0.01λ≤third thickness $T_3$≤λ) such as 0.05λ, 0.1λ, 0.3λ, 0.5λ, 0.7λ, or 0.9λ. For example, the third thickness $T_3$ may range from 0.02 times to 0.5 times of the wavelength λ of the electromagnetic wave modulated by the electronic device 10A (0.02λ≤$T_3$≤0.5λ).

It should be understood that if the third thickness $T_3$ of the dielectric layer 206 is too small (e.g., less than 5 μm or 0.01λ), the distance between the patch 204 and the common electrode layer 208 may be too short, resulting in a reduction of the radiation efficiency of electromagnetic waves; on the other hand, if the third thickness $T_3$ of the dielectric layer 206 is too large (e.g., greater than the second thickness $T_2$ or λ), the intensity of the induced electromagnetic field may not be sufficient to radiate.

Moreover, according to some embodiments of present disclosure, "the third thickness $T_3$" of the dielectric layer 206 refers to the maximum thickness of the dielectric layer 206 in a normal direction Z of the first substrate 102.

As described above, the electronic device 10A includes a common electrode layer 208, as shown in FIG. 3. The common electrode layer 208 may be patterned to have an opening 208p, the opening 208p may expose a portion of the inner side 206a of the dielectric layer 206. In addition, the opening 208p may correspond to the patch 204, for example, the patch 204 may overlap the opening 208p in a normal direction Z of the first substrate 102. Besides, in some embodiments, the common electrode layer 208 may be electrically grounded. In one embodiment, the common electrode layer 208 corresponding to an end of the phase shifter 104 may be patterned to form a coplanar waveguide 203 (shown in FIG. 1).

In some embodiments, the material of the common electrode layer 208 may include a metal conductive material, a transparent conductive material, or a combination thereof. The metal conductive material and the transparent conductive material may be similar to the material of the phase shifter 104, which will not be repeated here.

As shown in FIG. 3, in some embodiments, the patch 204 may have a first width $W_1$, and the opening 208p of the common electrode layer 208 may have a second width $W_2$. In some embodiments, the second width $W_2$ of the opening 208p may be greater than or equal to the first width $W_1$ of the patch 204 in a first direction (e.g., X direction); the width of the opening 208p may be less than or equal to the width of the patch 204 in a second direction (e.g., Y direction), which may help electromagnetic wave signals pass through the opening 208p and transmit to the patch 204. The first direction may be different from the second direction. For example, the first direction may be substantially perpendicular to the second direction.

It should be understood that, according to some embodiments of the present disclosure, the first direction may be an extension direction of the opening 208p, but is not limited thereto. In addition, the first direction may be the length direction of the opening 208p, but is not limited thereto. According to some embodiments of the present disclosure, the "length direction" refers to a direction along or substantially parallel to the long axis of an object (for example, the X direction shown in FIG. 2). The long axis may be closest to the maximum lengthwise dimension of the object. For an object without a specific long axis, the long axis may be the long side of the minimum rectangle that can surround the object.

As shown in FIG. 3, according to some embodiments, the patch 204 and the common electrode layer 208 may both be disposed on the inner side 202a of the second substrate 202. In other words, the patch 204 and the common electrode layer 208 are disposed on the same side of the second substrate 202, but is not limited thereto.

It should be noted that, an electronic device with the patch 204 and the common electrode layer 208 on respective two sides of the second substrate 202 has to experience a longer period of a metal coating process (e.g., a back-coating process) at a high temperature, which may increase the risk of deterioration of modulation materials or substrate cracks due to a high processing temperature. According to some embodiments of the present disclosure, the patch 204 and the common electrode layer 208 disposed on a single side of the second substrate 202 may reduce the risk of deterioration of modulation materials or substrate cracks due to a high processing temperature. The manufacturing method of the electronic device 10A is described below in more detail.

In addition, referring to FIG. 3, the electronic device 10A includes a liquid-crystal layer 300. The liquid-crystal layer 300 may be disposed between the first substrate 102 and the second substrate 202, and the liquid-crystal layer 300 may be disposed between the phase shifter 104 and the common electrode layer 208. As described above, according to some embodiments, the capacitance and the phase difference may be adjusted by applying different electric fields to the liquid-crystal layer 300 to control the transmission direction of the electromagnetic signal passing through the opening 208p and the patch 204.

In some embodiments, the material of the liquid-crystal layer 300 may include nematic liquid crystal, smectic liquid crystal, cholesterol liquid crystal, blue-phase liquid crystal, other suitable liquid-crystal material, or a combination thereof, but is not limited thereto. However, according to other embodiments, a material having a refractive index that can be modulated may be used to replace the liquid-crystal layer 300, e.g., a transition metal nitride, an electro-optics material, or a combination thereof, but is not limited thereto. For example, the electro-optics material may include lithium $LiNbO_3$, $LiTaO_3$, CdTe, $NH_4H_2PO_4$, $KH_2PO_4$, potassium tantalate niobate (KTN), lead zirconate titanate (PZT), transition metal nitrides (such as TiN, HfN, TaN, or ZrN), or a combination thereof, but is not limited thereto. In one embodiment, the liquid-crystal layer 300 may include isothiocyanate, or other functional groups with high polarity, but is not limited thereto.

Referring to FIG. 3, in some embodiments, the electronic device 10A may further include a first buffer layer 106, the first buffer layer 106 may be disposed between the first substrate 102 and the phase shifter 104. For example, in some embodiments, the first buffer layer 106 may be in contact with the inner side 102a of the first substrate 102 and the phase shifter 104. The first buffer layer 106 may reduce the difference in coefficient of thermal expansion between the first substrate 102 and the phase shifter 104, and thereby the warpage problem of the first substrate 102 may be improved.

In some embodiments, the electronic device 10A may further include a second buffer layer 210, the second buffer layer 210 may be disposed between the second substrate 202 and the patch 204. In some embodiments, the second buffer layer 210 may be in contact with the inner side 202a of second substrate 202, the patch 204, and the dielectric layer 206. The second buffer layer 210 may reduce the difference in coefficient of thermal expansion between the second substrate 202 and the patch 204, and thereby the warpage problem of the second substrate 202 may be improved.

In some embodiments, the first buffer layer 106 and the second buffer layer 210 may include an insulating material. In some embodiments, the material of the first buffer layer 106 and the second buffer layer 210 may include an organic material, an inorganic material, or a combination thereof, but is not limited thereto. In some embodiments, the organic material may include polyethylene terephthalate (PET), polyethylene (PE), polyethersulfone (PES), polycarbonate (PC), polymethylmethacrylate (PMMA), isoprene, phenol-formaldehyde resin, benzocyclobutene (BCB), perfluorocyclobutane (PECB), or a combination thereof, but is not limited thereto. In some embodiments, the inorganic material may include silicon nitride, silicon oxide, silicon oxynitride, aluminum oxide, titanium oxide, or a combination thereof, but is not limited thereto. Moreover, the material of the first buffer layer 106 may be the same as or different from the material of the second buffer layer 210.

Furthermore, the first buffer layer 106 and the second buffer layer 210 may have a single-layer structure or a multilayer structure, for example, the first buffer layer 106 and the second buffer layer 210 may include a plurality of sublayers. In embodiments where the first buffer layer 106 or the second buffer layer 210 includes a plurality of sublayers, the material of each sublayer may be the same or different.

Figure 11A:
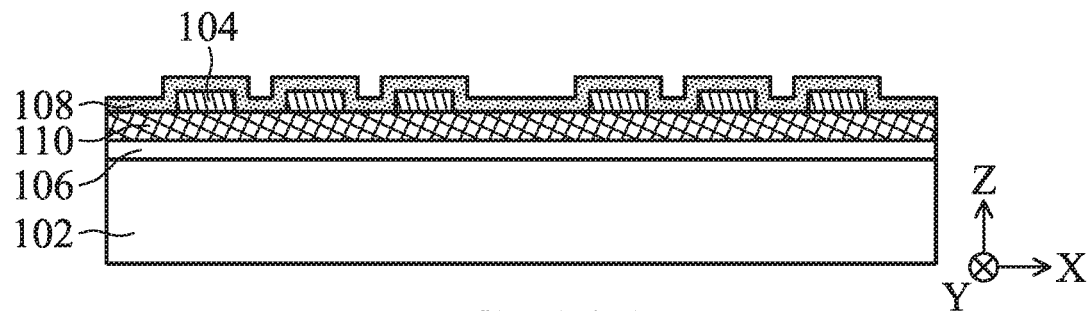
FIGS. 11A-11H show cross-sectional views of intermediate stages in the process of an electronic device in accordance with some embodiments of the present disclosure.
Figure 11B:
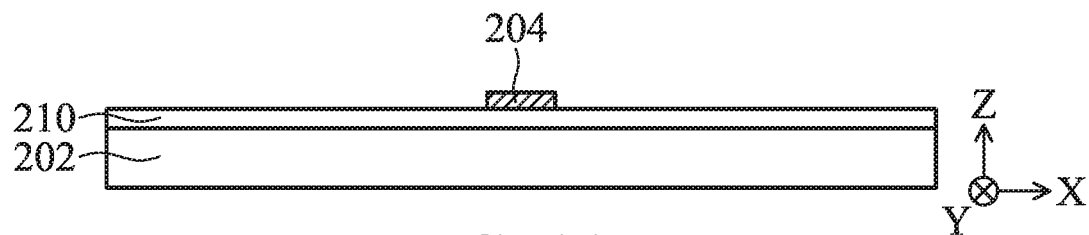
Figure 11C:
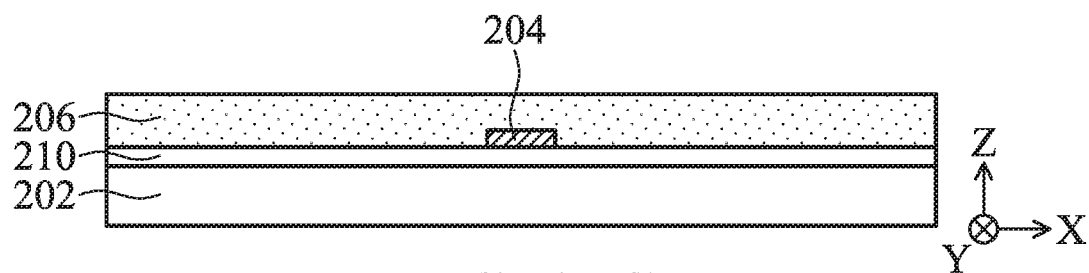
Figure 11D:
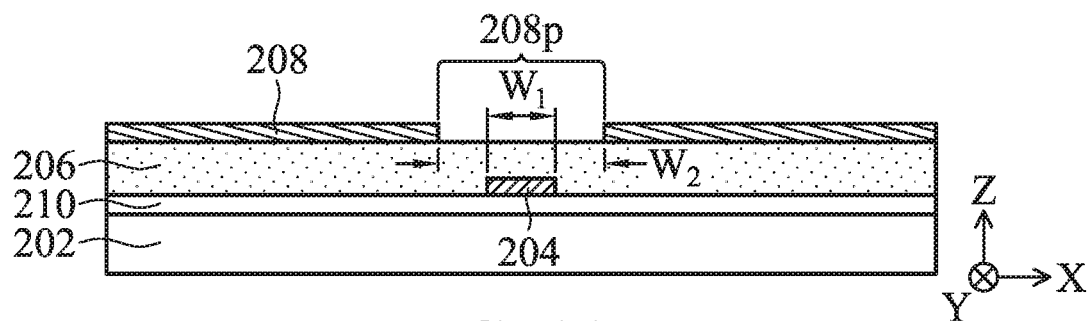
Figure 11E:
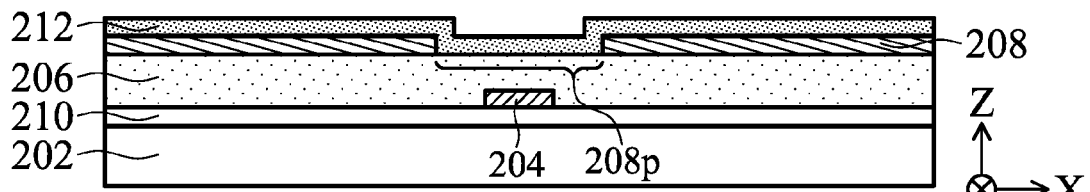
Figure 11F:
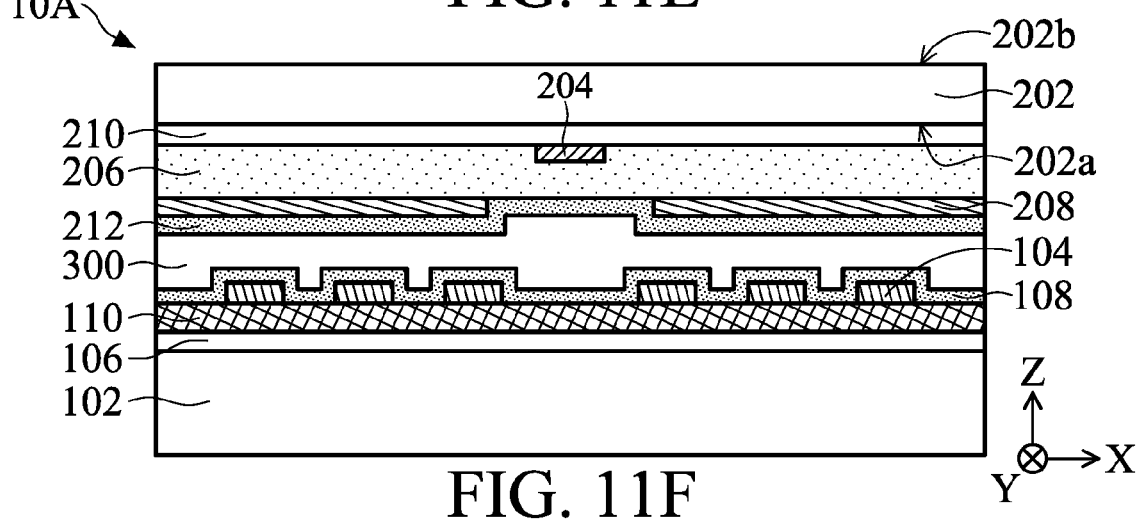

Further, in some embodiments, the electronic device 10A may further include a circuit layer 110 (refer to FIG. 11F). The circuit layer 110 may be disposed between the first substrate 102 and the phase shifter 104. In some embodiments, the circuit layer 110 may include a driving element (such as a thin film transistor) and a signal line electrically connected to the driving element. The signal line may include, for example, a data line, a scan line (gate lines), etc.

Referring to FIG. 3, in some embodiments, the electronic device 10A may further include a first alignment layer 108, the first alignment layer 108 may be disposed between the phase shifter 104 and the liquid-crystal layer 300. In some embodiments, the first alignment layer 108 may be disposed between the first buffer layer 106 and the liquid-crystal layer 300. As shown in FIG. 3, in some embodiments, the first alignment layer 108 may be conformally formed on the first buffer layer 106 and the phase shifter 104, but is not limited thereto.

In addition, in some embodiments, the electronic device 10A may further include a second alignment layer 212, the second alignment layer 212 may be disposed between the common electrode layer 208 and the liquid-crystal layer 300. In some embodiments, the second alignment layer 212 may be disposed between the dielectric layer 206 and the liquid-crystal layer 300. As shown in FIG. 3, in some embodiments, the second alignment layer 212 may be conformally formed on the common electrode layer 208 and the dielectric layer 206, but is not limited thereto. In some embodiments, the second alignment layer 212 may also be extended (or disposed) in the opening 208p.

In some embodiments, the first alignment layer 108 and the second alignment layer 212 may be used to help control the arrangement direction of the liquid-crystal molecules in the liquid-crystal layer 300. In some embodiments, the material of the first alignment layer 108 and the second alignment layer 212 may include an organic material, an inorganic material, or a combination thereof. For example, the organic material may include polyimide (PI), photoreactive polymer material, or a combination thereof, but is not limited thereto. The inorganic material may include, for example, SiO2, other materials having an alignment capability, or a combination thereof, but is not limited thereto. In other embodiments, at least one of the first alignment layer 108 and the second alignment layer 212 may be omitted, but is not limited thereto.

Figure 4:
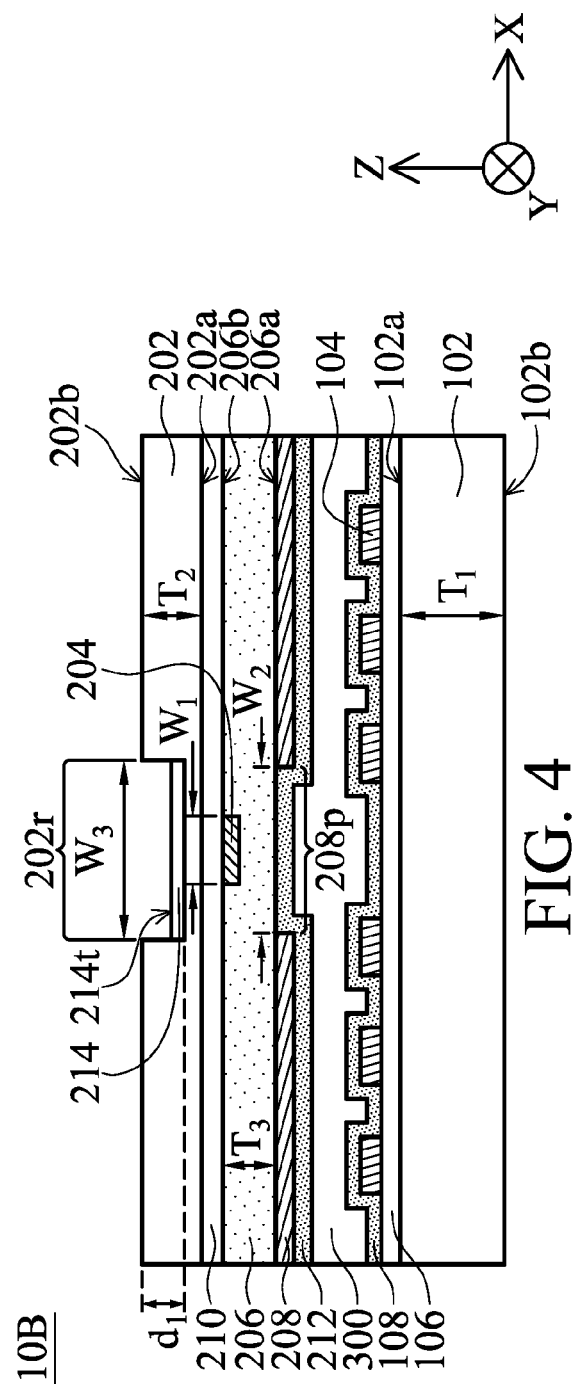
FIG. 4 shows a cross-sectional view of an electronic device in accordance with some embodiments of the present disclosure.

Next, FIG. 4 shows a cross-sectional view of the electronic device 10B in accordance with other embodiments of the present disclosure. It should be understood that the same or similar components or elements in above and below contexts are represented by the same or similar reference numerals. The materials, manufacturing methods and functions of these components or elements are the same as or similar to those described above and thus will not be repeated below.

The electronic device 10B shown in FIG. 4 is similar to the electronic device 10A shown in FIG. 3, except that the second substrate 202 in the electronic device 10B may be partially thinned. Specifically, in this embodiment, the second substrate 202 may have a recess 202r, and the recess 202r may correspond to the patch 204. In some embodiments, the recess 202r may overlap the patch 204 in a normal direction Z of the first substrate 102.

In some embodiments, the recess 202r may be recessed a first distance $d_1$ in a direction from the outer side 202b of the second substrate 202 toward the inner side 202a, and the first distance $d_1$ may be considered as a depth of the recess 202r. In some embodiments, the recess 202r may be formed on the inner side 202a. In some embodiments, the first distance $d_1$ may be less than the second thickness $T_2$ of the second substrate 202. In some embodiments, the first distance $d_1$ may be equal to the second thickness $T_2$ of the second substrate 202, i.e. an opening is formed through the second substrate 202 and the opening exposes the second buffer layer 210 or the dielectric layer 206.

In addition, the recess 202r may have a third width W3. In some embodiments, the third width W3 of the recess 202r may be greater than or equal to the first width $W_1$ of the patch 204. According to some embodiments of the present disclosure, the third width W3 refers to the maximum width of the recess 202r substantially in the X direction on any cross-section. In some embodiments, the area of the recess 202r may be greater than or equal to the area of the patch 204. The area refers to the bottom area of the recess 202r and the patch 204 in accordance with some embodiments of the present disclosure.

It should be noted that, according to some embodiments, the second substrate 202 having a less thickness at a position corresponding to the patch 204 may further reduce the dielectric loss of electromagnetic waves. Furthermore, it should be understood that although the figure illustrates the partially thinned second substrate 202, the second substrate 202 may also be entirely thinned according to other embodiments.

In addition, as shown in FIG. 4, in some embodiments, the electronic device 10B may further include a protection layer 214, the protection layer 214 may be disposed (or filled) in the recess 202r. In some embodiments, the top surface 214t of the protection layer 214 may be lower than the outer side 202b of the second substrate 202. In other embodiments, the top surface 214t of the protection layer 214 may be substantially level with the outer side 202b of the second substrate 202. In an embodiment, the dielectric coefficient of the protection layer 214 may be different from the dielectric coefficient of the second substrate 202. For example, the dielectric coefficient of the protection layer 214 is less than or equal to the dielectric coefficient of the second substrate 202. The dielectric loss of electromagnetic waves may be reduced when the dielectric coefficient of the protection layer 214 is less than or equal to that of the second substrate, but is not limited thereto.

In some embodiments, the material of the protection layer 214 may include polyimide (PI), polymethylmethacrylate (PMMA), polyethylene terephthalate (PET), liquid-crystal polymer (LCP) material, polyethylene (PE), polyethersulfone (PES), polycarbonate (PC), isoprene, phenol-formaldehyde resin, benzocyclobutene (BCB), perfluorocyclobutane (PECB), or a combination thereof, but is not limited thereto.

Next, FIG. 5 shows a cross-sectional view of the electronic device 10C in accordance with other embodiments of the present disclosure. The electronic device 10C shown in FIG. 5 is similar to the electronic device 10A shown in FIG. 3, except that the electronic device 10C may not have a second substrate. In this embodiment, the electronic device 10C may also not have a second buffer layer. In other words, in this embodiment, the outer side 206b of the dielectric layer 206 and the top surface 204t of the patch 204 may be exposed to the environment.

In detail, in this embodiment, the electronic device 10C includes a first substrate 102, a phase shifter 104, a dielectric layer 206, a patch 204, a common electrode layer 208, a liquid-crystal layer 300, a first alignment layer 108, and a second alignment layer 212. In addition, the phase shifter 104 may be disposed on the first substrate 102, the dielectric layer 206 may be disposed on the phase shifter 104, the patch 204 may be disposed in the dielectric layer 206, and the common electrode layer 208 may be disposed between the dielectric layer 206 and the first substrate 102. The liquid-crystal layer 300 may be disposed between the phase shifter 104 and the dielectric layer 206, the first alignment layer 108 may be disposed between the phase shifter 104 and the liquid-crystal layer 300, and the second alignment layer 212 may be disposed between the common electrode layer 208 and the liquid-crystal layer 300.

According to some embodiments, an electronic device 10C without a second substrate may reduce the thickness of the entire structure. Furthermore, in some embodiments, an electronic device 10C may not have a first substrate, and a protection layer may be optionally disposed under the first buffer layer 106. Therefore, the electronic device 10C may be more flexible or plastic, which is advantageous to be mounted on the surface of various devices.

Next, FIG. 6 shows a cross-sectional view of the electronic device 10D in accordance with other embodiments of the present disclosure. The electronic device 10D shown in FIG. 6 is similar to the electronic device 10C shown in FIG. 5, except that the electronic device 10D may further include a capping layer 216, the capping layer 216 may be in contact with the patch 204. The dielectric layer 206 may be disposed between the capping layer 216 and the common electrode layer 208. In this embodiment, the capping layer 216 may be disposed on the outer side 206b of the dielectric layer 206 to protect the patch 204.

In some embodiments, the material of the capping layer 216 may be similar to the material of the protection layer 214 (as shown in FIG. 4), which will not be described herein again.

Figures 7, 8:
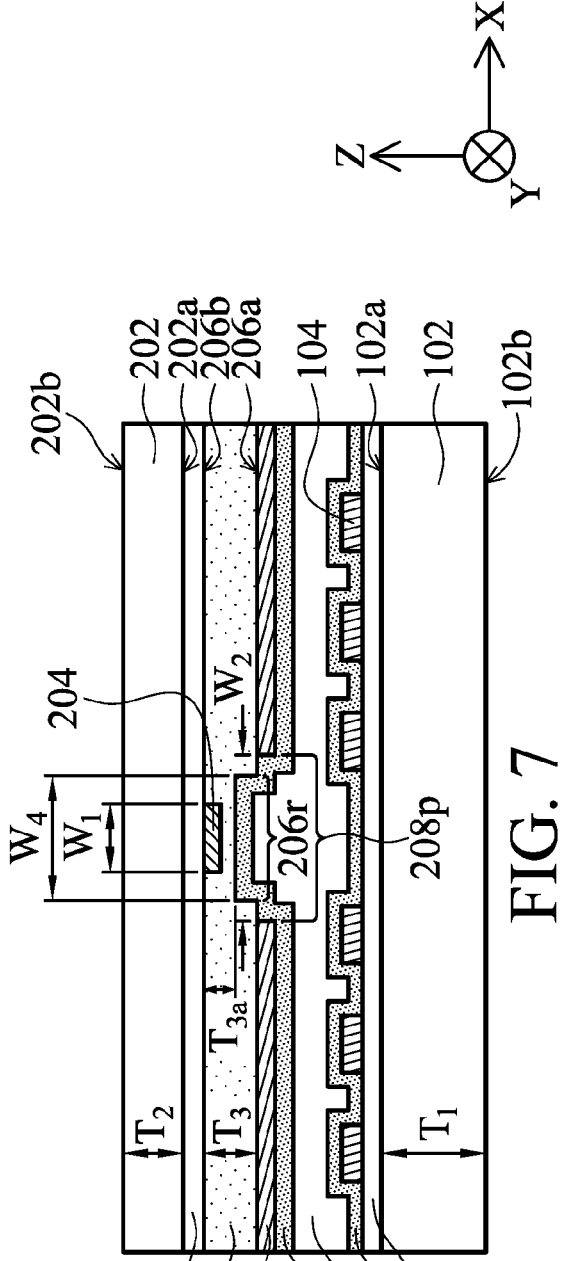
FIG. 7 shows a cross-sectional view of an electronic device in accordance with some embodiments of the present disclosure.
FIG. 8 shows a cross-sectional view of an electronic device in accordance with some embodiments of the present disclosure.

Next, FIG. 7 shows a cross-sectional view of the electronic device 10E in accordance with other embodiments of the present disclosure. The electronic device 10E shown in FIG. 7 is similar to the electronic device 10A shown in FIG. 3, except that the dielectric layer 206 may be partially thinned in the electronic device 10E. Specifically, in this embodiment, the dielectric layer 206 may further include a recess 206r, and the recess 206r may correspond to the patch 204. In some embodiments, the recess 206r may overlap the patch 204 in a normal direction Z of the first substrate 102.

In some embodiments, the recess 206r may be recessed in a direction from the inner side 206a of the dielectric layer 206 toward the outer side 206b. In some embodiments, the thinned dielectric layer 206 (the dielectric layer 206 corresponding to the recess 206r) may have a thickness of $T_{3a}$. In some embodiments, the thickness $T_{3a}$ is less than the third thickness $T_3$ of the dielectric layer 206. Moreover, according to some embodiments of present disclosure, "the thickness $T_{3a}$" refers to the minimum thickness of the thinned region of the dielectric layer 206 in a normal direction Z of the first substrate 102. In an embodiment, the thickness $T_{3a}$ may be the minimum thickness of the dielectric layer 206 that does not overlap the patch 204.

In addition, the recess 206r may have a fourth width $W_4$. In some embodiments, the fourth width $W_4$ of the recess 206r may be greater than or equal to the first width $W_1$ of the patch 204. According to some embodiments of the present disclosure, the fourth width $W_4$ may refer to the maximum width of the recess 206r on any cross-section substantially parallel to the recess direction of the opening 208p (e.g., the X direction as shown in the figure, may also refer to FIG. 2). Furthermore, in some embodiments, the area of the recess 206r may also be greater than or equal to the area of the patch 204. According to some embodiments of the present disclosure, the area refers to the top area or bottom area of the recess 206r and the patch 204.

It should be noted that, according to some embodiments, the dielectric layer 206 having a recess 206r at the position corresponding to the patch 204 may improve electromagnetic radiation signals in the electronic device 10E.

In addition, as shown in FIG. 7, in some embodiments, the second width $W_2$ of the opening 208p of the common electrode layer 208 may be greater than the fourth width $W_4$ of the recess 206r. In some embodiments, the recess 206r may also overlap the opening 208p in a normal direction Z of the first substrate 102. In some embodiments, the opening 208p and the recess 206r may form a stepped recess structure. In some embodiments, a second alignment layer 212 may be conformally extended into the opening 208p and the recess 206r to form a second alignment layer 212 with a stepped structure. In these embodiments, the stepped recess structure formed by the opening 208p and the recess 206r may reduce the probability of damage or deterioration of the second alignment layer 212.

Next, FIG. 8 shows a cross-sectional view of the electronic device 10F in accordance with other embodiments of the present disclosure. The electronic device 10F shown in FIG. 8 is similar to the electronic device 10E shown in FIG. 7, except that the dielectric layer 206 may be partially thinned to expose at least a portion of the patch 204. Specifically, in this embodiment, the dielectric layer 206 may include an opening 206p, and the opening 206p may correspond to the patch 204. In some embodiments, the opening 206p may overlap the patch 204 in a normal direction Z of the first substrate 102. In addition, the opening 206p may expose at least a portion of the patch 204.

In some embodiments, the opening 206p may be extended in a direction from the inner side 206a of the dielectric layer 206 toward the outer side 206b. In some embodiments, the thinned dielectric layer 206 (the dielectric layer 206 corresponding to the opening 206p) may have a thickness $T_{3b}$. In some embodiments, the thickness $T_{3b}$ may be less than the third thickness $T_3$ of the dielectric layer 206. In this embodiment, the thickness $T_{3b}$ is substantially equal to the thickness of the patch 204 (not shown). Moreover, according to some embodiments of present disclosure, "the thickness $T_{3b}$" refers to the minimum thickness of the thinned region of the dielectric layer 206 in a normal direction Z of the first substrate 102. In an embodiment, the thickness $T_{3b}$ may be the minimum thickness of the dielectric layer 206 that does not overlap the patch 204.

In addition, the opening 206p may have a fifth width $W_5$. In some embodiments, the fifth width $W_5$ of the opening 206p may be greater than or equal to the first width $W_1$ of the patch 204. According to some embodiments of the present disclosure, the fifth width $W_5$ may be the maximum width of the opening 206p on any cross-section substantially parallel to the extension direction of the opening 208p (e.g., the X direction as shown in the figure, may also refer to FIG. 2). Furthermore, in some embodiments, the area of the opening 206p may be greater than or equal to the area of the patch 204. According to some embodiments of the present disclosure, the area refers to the top area or bottom area of the opening 206p and the patch 204.

It should be noted that, according to some embodiments, the dielectric layer 206 having an opening 206p at the position corresponding to the patch 204 may improve electromagnetic radiation signals in the electronic device 10F.

In addition, as shown in FIG. 8, in some embodiments, the second width $W_2$ of the opening 208p of the common electrode layer 208 may be greater than the fifth width $W_5$ of the opening 206p. In some embodiments, the opening 206p may also overlap the opening 208p in a normal direction Z of the first substrate 102. In some embodiments, the opening 208p and the opening 206p may form a stepped recess structure. In some embodiments, a second alignment layer 212 may be conformally extended into the opening 208p and the opening 206p to form a second alignment layer 212 having a stepped structure.

Next, FIG. 9 shows a cross-sectional view of the electronic device 10G in accordance with other embodiments of the present disclosure. The electronic device 10G shown in FIG. 9 is similar to the electronic device 10A shown in FIG. 3, except that, in the electronic device 10G, a portion of the second buffer layer 210 is removed to form an opening 210p and the patch 204 may be disposed in the opening 210p. Specifically, in this embodiment, the opening 210p may overlap the patch 204 in a normal direction Z of the first substrate 102. In addition, in this embodiment, the second buffer layer 210 may not overlap the patch 204 in a normal direction Z of the first substrate 102. In this embodiment, the patch 204 may be in contact with the inner side 202a of the second substrate 202.

As shown in FIG. 9, the second buffer layer 210 and the patch 204 are separated by a second distance dz. In some embodiments, the second distance $d_2$ may range from 1 μm to 100 μm (1 μm≤the second distance $d_2$≤100 μm), or from 2 μm to 50 μm. For example, the second distance $d_2$ may be 5 μm, 10 μm, 20 μm, 40 μm, 60 μm, or 80 μm. It should be understood that, if the second distance $d_2$ is too large, the coverage of the buffer layer 210 is low, and it would be difficult to reduce the difference between the expansion coefficients; on the other hand, if the second distance $d_2$ is too short, then it would be difficult to dispose the patch 204 in the opening 210p.

It should be noted that, according to some embodiments, the second buffer layer 210 may not be disposed on the position corresponding to the patch 204, and thereby electromagnetic radiation signals of the electronic device 10G of may be improved.

Next, FIG. 10 shows a cross-sectional view of the electronic device 10H in accordance with other embodiments of the present disclosure. The electronic device 10H shown in FIG. 10 is similar to the electronic device 10A shown in FIG. 3, except that, in the electronic device 10H, the dielectric layer 206 may further include a plurality of voids 206e. In this embodiment, the dielectric layer 206 may include voids 206e, the voids 206e can be used to accommodate gas generated by the electronic device 10H in an operating environment of high temperature, and thereby the operational reliability of the electronic device 10H may be improved.

Specifically, the voids 206e may have a diameter $D_P$. In some embodiments, the diameter $D_P$ may range from 0.1 μm to 100 μm (0.1 μm≤diameter $D_P$≤100 μm), from 0.5 μm to 90 μm, from 5 μm to 80 μm, or from 10 μm to 70 μm, for example, the diameter $D_P$ may be 10 μm, 25 μm, 40 μm, or 60 μm. According to some embodiments of the present disclosure, the diameter $D_P$ may refer to the maximum width of the voids 206e on any cross-section substantially parallel to the extension direction of the opening 208p (e.g., the X direction as shown in the figure, may also refer to FIG. 2).

Next, FIGS. 11A-11H show cross-sectional views of intermediate stages in the process of the electronic device 10A (as shown in FIG. 11F) in accordance with some embodiments of the present disclosure. It should be understood that, according to some embodiments, additional operations can be provided before, during, and/or after the manufacturing method of the electronic device 10A is performed. According to some embodiments, some of the described operations can be replaced or eliminated. According to some embodiments, the order of the described operations is interchangeable.

First, referring to FIG. 11A, a first substrate 102 is provided, and then a phase shifter 104 is formed on the first substrate 102. In detail, in some embodiments, a first conductive material may be formed on the first substrate 102 first, and then a portion of the conductive material is removed to pattern the conductive material, and thereby a phase shifter 104 is formed.

In some embodiments, the phase shifter 104 may be formed by a physical vapor deposition (PVD) process, a chemical vapor deposition (CVD) process, an electroplating process, an electroless plating process, other suitable methods, or a combination thereof. The physical vapor deposition process may include, for example, a sputtering process, an evaporation process, or a pulsed laser deposition, but is not limited thereto. The chemical vapor deposition process may include, for example, a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, etc., but is not limited thereto.

In some embodiments, the phase shifter 104 may be formed by using a patterning process to remove a portion of the conductive material. In some embodiments, the patterning process may include a photolithographic process and an etching process. The photolithography process may include photoresist coating (such as spin coating), soft bake, hard bake, mask alignment, exposure, post-exposure bake, photoresist development, cleaning, drying, etc., but is not limited thereto. The etching process may include a dry etching process or a wet etching process, but is not limited thereto.

As shown in FIG. 11A, in some embodiments, a first buffer layer 106 may be further formed on the first substrate 102 before the phase shifter 104 is formed on the first substrate 102, and the first buffer layer 106 may be in contact with the first substrate 102.

In some embodiments, the first buffer layer 106 may be formed by the physical vapor deposition process described above, the chemical vapor deposition process described above, a coating process, a printing process, other suitable processes, or a combination thereof.

Furthermore, in some embodiments, a circuit layer 110 may be formed on the first buffer layer 106 before the phase shifter 104 is formed on the first substrate 102. As shown in FIG. 11A, the circuit layer 110 may be formed between the first substrate 102 and the phase shifter 104.

In some embodiments, the circuit layer 110 may be formed by a physical vapor deposition process described above, a chemical vapor deposition process described above, an electroplating process, an electroless plating process, other suitable methods, or a combination thereof. In addition, the circuit layer 110 may be patterned by one or more photolithography processes and etching processes.

As shown in FIG. 11A, in some embodiments, a first alignment layer 108 may be further formed on to the phase shifter 104 after the phase shifter 104 is formed on the first substrate 102. In some embodiments, the first alignment layer 108 may be conformally formed on the phase shifter 104.

In some embodiments, the first alignment layer 108 may be formed by the physical vapor deposition process described above, the chemical vapor deposition process described above, a coating process, a printing process, other suitable processes, or a combination thereof.

Next, referring to FIG. 11B, a second substrate 202 is provided and a patch 204 is formed on the second substrate 202. In detail, in some embodiments, a conductive material may be formed on the second substrate 202, and then a portion of the conductive material is removed to pattern the conductive material to form the patch 204.

In some embodiments, the patch 204 may be formed by the physical vapor deposition process described above, the chemical vapor deposition process described above, an electroplating process, an electroless plating process, other suitable methods, or a combination thereof. In addition, the patch 204 may be patterned by one or more photolithography processes and etching processes. In some embodiments, the photolithography process may include photoresist coating (such as spin coating), soft bake, hard bake, mask alignment, exposure, post-exposure bake, photoresist development, cleaning, drying, etc., but is not limited thereto. In some embodiments, the etching process may include a dry etching process or a wet etching process, but is not limited thereto.

As shown in FIG. 11B, in some embodiments, a second buffer layer 210 may be further formed on the second substrate 202 before the patch 204 is formed on the second substrate 202, and the second buffer layer 210 may be in contact with the second substrate 202.

In some embodiments, the second buffer layer 210 may be formed by the physical vapor deposition process described above, the chemical vapor deposition process described above, a coating process, a printing process, other suitable processes, or a combination thereof.

Next, referring to FIG. 11C, a dielectric layer 206 is formed on the patch 204 and also on the second substrate 202. As shown in FIG. 11C, in some embodiments, the dielectric layer 206 may be in contact with the patch 204 and the second buffer layer 210.

In some embodiments, the dielectric layer 206 may be formed by the physical vapor deposition process described above, the chemical vapor deposition process described above, a coating process, a printing process, other suitable processes, or a combination thereof.

Next, referring to FIG. 11D, a common electrode layer 208 is formed on the dielectric layer 206, and the dielectric layer 206 is between the common electrode layer 208 and the second substrate 202. Specifically, in some embodiments, the common electrode layer 208 may be patterned to have an opening 208p. As described above in FIG. 3, the patch 204 may have a first width $W_1$, the opening 208p of the common electrode layer 208 may have a second width $W_2$. In some embodiments, the second width $W_2$ may be greater than or equal to the first width $W_1$.

In some embodiments, the common electrode layer 208 may be formed by the physical vapor deposition process described above, the chemical vapor deposition process described above, an electroplating process, an electroless plating process, other suitable methods, or a combination thereof. In addition, the common electrode layer 208 may be patterned by one or more photolithography processes and etching processes.

Next, referring to FIG. 11E, in some embodiments, a second alignment layer 212 may be further formed on the common electrode layer 208 after the common electrode layer 208 is formed on the dielectric layer 206. In some embodiments, the second alignment layer 212 may be conformally formed on the common electrode layer 208 and be conformally extended (or be disposed) in the opening 208p.

In some embodiments, the second alignment layer 212 may be formed by the physical vapor deposition process described above, the chemical vapor deposition process described above, a coating process, a printing process, other suitable processes, or a combination thereof.

Next, referring to FIG. 11F, the first substrate 102 and the second substrate 202 are assembled such that the patch 204 is on an inner side 202a of the second substrate 202, and the inner side 202a faces the first substrate 102. In addition, a liquid-crystal layer 300 is formed between the first substrate 102 and the second substrate 202, and the liquid-crystal layer 300 may be formed between the phase shifter 104 and the common electrode layer 208.

In some embodiments, the liquid-crystal layer 300 may be formed by a one drop filling (ODF) method before the first substrate 102 and the second substrate 202 are assembled, or the liquid-crystal may be filled by a vacuum injection method after the first substrate 102 and the second substrate 202 are assembled, but the present disclosure is not limited thereto.

Figure 11G:
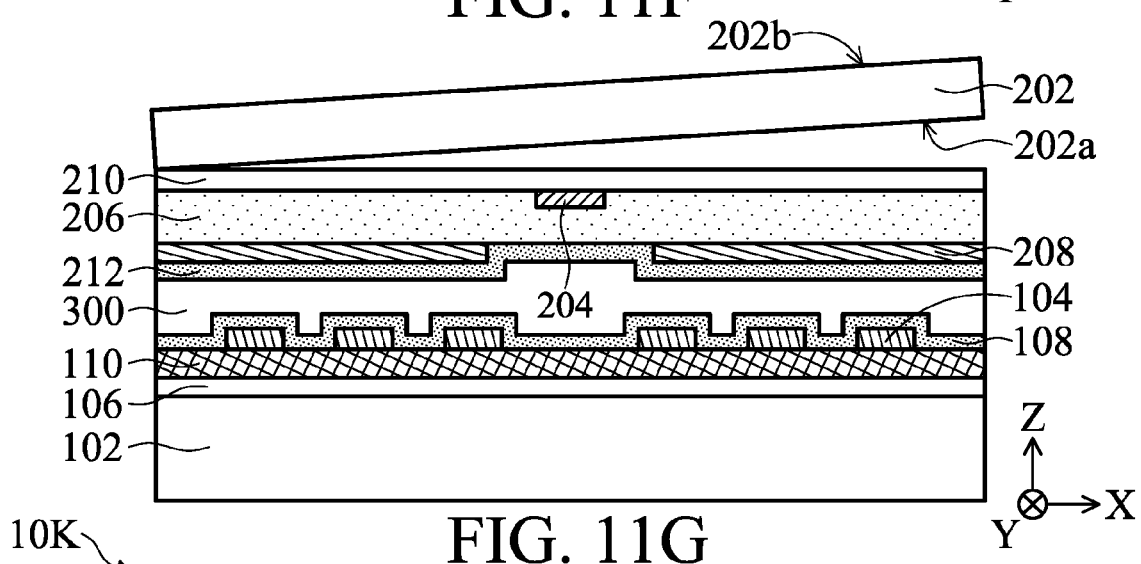
Figure 11H:
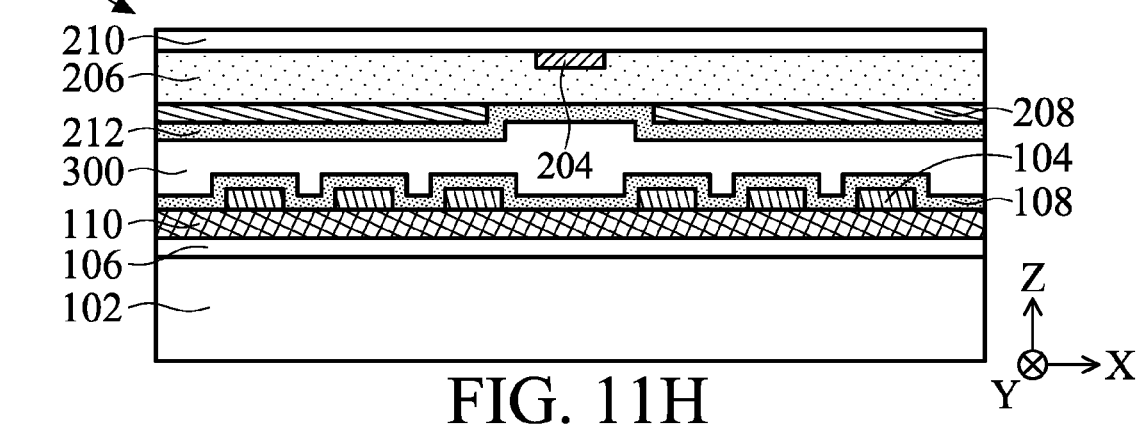

Next, referring to FIG. 11G and FIG. 11H, in some embodiments, the second substrate 202 may be optionally removed (FIG. 11G) to form an electronic device 10K (FIG. 11H) after the liquid-crystal layer 300 is formed between the first substrate 102 and the second substrate 202. In some embodiments, the second buffer layer 210 may be exposed to the environment after the second substrate 202 is removed (FIG. 11H). In some embodiments, the second buffer layer 210 may also be removed (not shown). Furthermore, a protection layer (not shown) may be formed on the patch 204 and the dielectric layer 206 after the second substrate 202 and/or the second buffer layer 210 is removed.

Figure 12A:
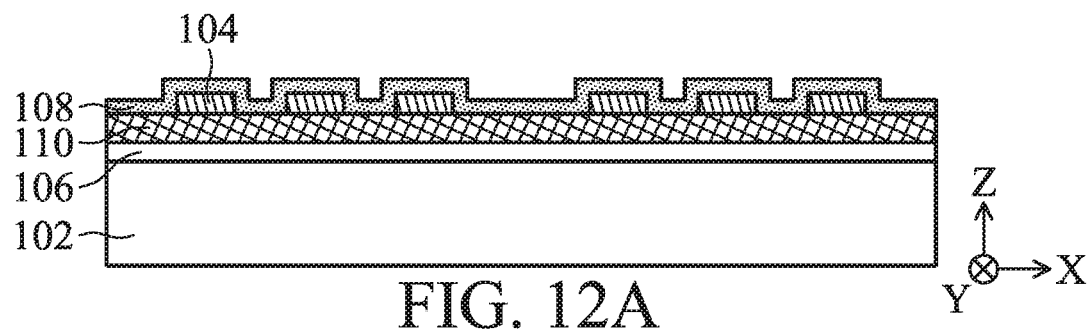
FIGS. 12A-12F show cross-sectional views of intermediate stages in the process of an electronic device in accordance with some embodiments of the present disclosure.
Figure 12B:
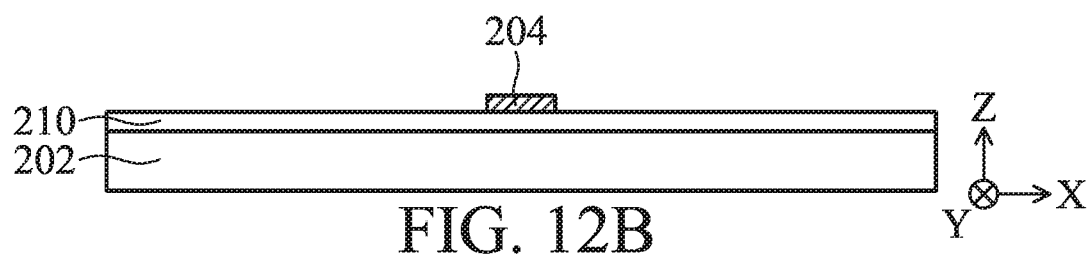
Figure 12C:
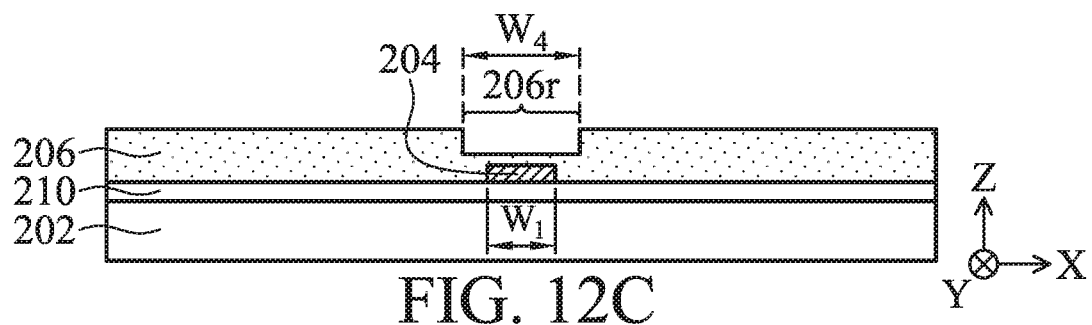
Figure 12D:
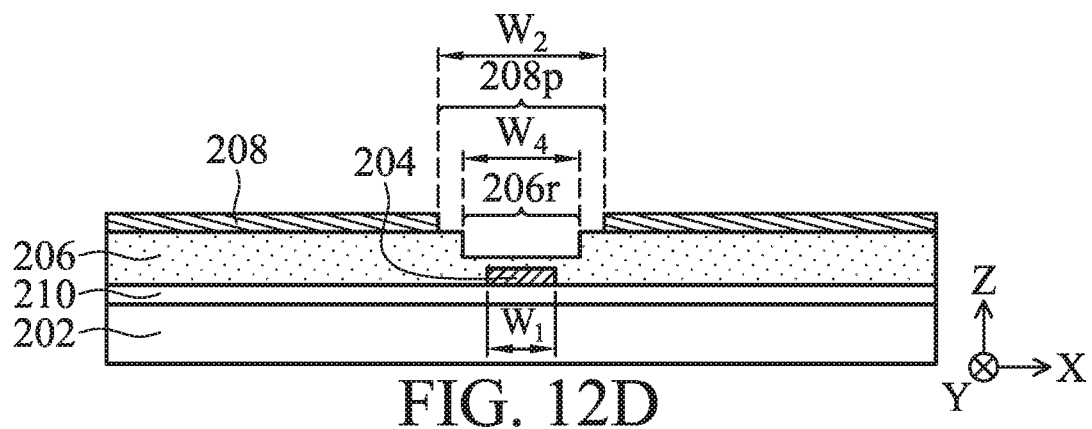
Figure 12E:
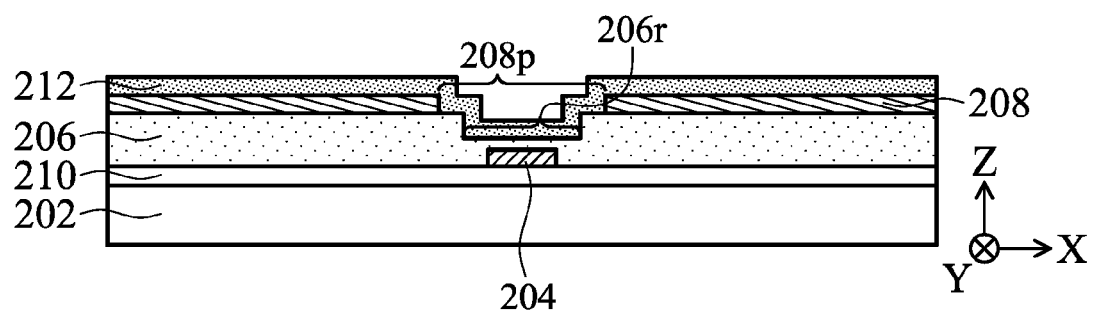
Figure 12F:
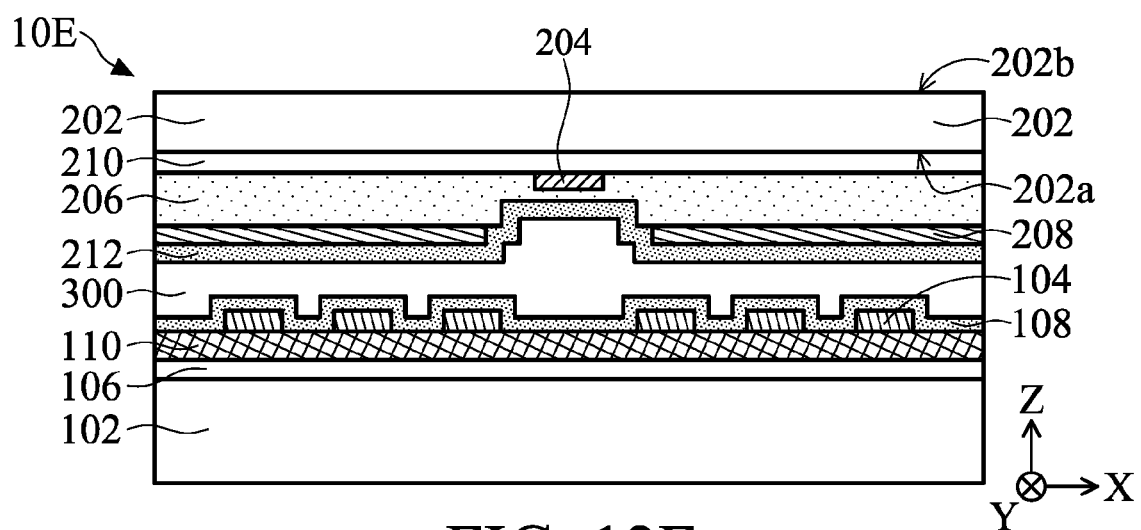

Next, referring to FIGS. 12A-12F which show cross-sectional views of intermediate stages in the process of an electronic device 10E (as shown in FIG. 12F) in accordance with other embodiments of the present disclosure.

FIGS. 12A and 12B are similar to FIGS. 11A and 11B described above, which will not be described herein again. Next, referring to of FIG. 12C, a dielectric layer 206 is formed on the patch 204, and the dielectric layer 206 is also formed on the second substrate 202. As shown in FIG. 12C, in some embodiments, the dielectric layer 206 may be in contact with the patch 204 and the second buffer layer 210. In some embodiments, a portion of the dielectric layer 206 may be removed after the dielectric layer 206 is formed on the patch 204, and a portion of the removed dielectric layer 206 may correspond to the patch 204.

Specifically, in some embodiments, a portion of the dielectric layer 206 may be removed to form a recess 206r after the dielectric layer 206 is formed on the patch 204. For example, a recess 206r may be formed by a half-tone mask or a gray tone mask exposure after developing and etching steps. In some embodiments, the recess 206r may overlap the patch 204 in a normal direction Z of the first substrate 102. In addition, as described above, the recess 206r may have a fourth width $W_4$. In some embodiments, the fourth width $W_4$ of the recess 206r may be greater than or equal to the first width $W_1$ of the patch 204.

In some embodiments, the dielectric layer 206 may be formed by the physical vapor deposition process described above, the chemical vapor deposition process described above, a coating process, a printing process, other suitable processes, or a combination thereof. In addition, the dielectric layer 206 may be patterned by one or more photolithography processes and etching processes to form the recess 206r. In other embodiments, the recess 206r may be replaced by forming an opening 206p as shown in FIG. 8 to expose at least a portion of the patch 204.

Next, referring to FIG. 12D, a common electrode layer 208 is formed on the dielectric layer 206, and the dielectric layer 206 is formed between the common electrode layer 208 and the second substrate 202. Specifically, in some embodiments, the common electrode layer 208 may be patterned to have an opening 208p. In some embodiments, the second width $W_2$ of the opening 208p of the common electrode layer 208 may be greater than or equal to the first width $W_1$ of the patch 204. Furthermore, in some embodiments, the second width $W_2$ of the opening 208p may be greater than or equal to the fourth width $W_4$ of the recess 206r. In other embodiments, the opening 208p and the recess 206r (or the opening 206p) may be formed sequentially after the dielectric layer 206 and the common electrode layer 208 are formed, but is not limited thereto.

It should be noted that, in some embodiments, since the second width $W_2$ of the opening 208p is larger than the fourth width $W_4$ of the recess 206r, the opening 208p and the recess 206r form a stepped recess structure, and thereby the risk of filling the common electrode layer 208 in the recess 206r due to the tolerances of the process may be reduced, or the difficulty of the process may be reduced.

In some embodiments, the common electrode layer 208 may be formed by the physical vapor deposition process described above, the chemical vapor deposition process described above, an electroplating process, an electroless plating process, other suitable methods, or a combination thereof. In addition, the common electrode layer 208 may be patterned by one or more photolithography processes and etching processes to form an opening 208p.

Next, referring to FIG. 12E, in some embodiments, a second alignment layer 212 may be further formed on the common electrode layer 208 after the common electrode layer 208 is formed on the dielectric layer 206. In some embodiments, the second alignment layer 212 may be conformally formed on the common electrode layer 208 and be conformally extended (or be disposed) in the recess 206r and the opening 208p.

In some embodiments, the second alignment layer 212 may be formed by the physical vapor deposition process described above, the chemical vapor deposition process described above, a coating process, a printing process, other suitable processes, or a combination thereof.

Next, referring to FIG. 12F, the first substrate 102 and the second substrate 202 are assembled such that the patch 204 is on an inner side 202a of the second substrate 202, and the inner side 202a faces the first substrate 102. In addition, a liquid-crystal layer 300 is formed between the first substrate 102 and the second substrate 202, and the liquid-crystal layer 300 is formed between the phase shifter 104 and the common electrode layer 208

In some embodiments, the liquid-crystal layer 300 may be formed by a one drop filling method before the first substrate 102 and the second substrate 202 are assembled, or the liquid-crystal may be filled by a vacuum injection method after the first substrate 102 and the second substrate 202 are assembled, but the present disclosure is not limited thereto.

In summary, according to some embodiments of the present disclosure, the provided manufacturing method of an electronic device may form a patch and a common electrode on the same side (single side) of a substrate. Compared with the process of forming metal layers on both sides of the substrate, the provided method may reduce the risk of deterioration of modulation materials or substrate cracks due to the processing temperature, but is not limited thereto. Furthermore, according to some embodiments of the present disclosure, the electronic device formed by the manufacturing method may reduce the dielectric loss of electromagnetic waves or improve operational reliability.

Although some embodiments of the present disclosure and the advantages thereof have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or to be developed later on, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as these embodiments do not depart from the spirit and scope of the present disclosure. The scope of protection of present disclosure is subject to the definition of the scope of the appended claims. Any embodiment or claim of the present disclosure does not need to achieve all the purposes, advantages, and features of the disclosure.

What is claimed is:

1. An electronic device, comprising:
   a first substrate;
   a plurality of phase shifters disposed on the first substrate;
   a second substrate having an inner side facing the first substrate;
   a plurality of patches disposed on the inner side of the second substrate;
   a common electrode layer;
   a dielectric layer disposed between the common electrode layer and the second substrate and on the plurality of patches; and
   a liquid-crystal layer disposed between the plurality of phase shifters and the common electrode layer,
   wherein a thickness of the dielectric layer is greater than or equal to 5 µm and less than or equal to a thickness of the second substrate.

2. The electronic device as claimed in claim 1, wherein the dielectric layer comprises a respective opening overlapping a corresponding one of the plurality of patches.

3. The electronic device as claimed in claim 2, wherein the respective opening exposes at least a portion of the corresponding one of the plurality of patches.

4. The electronic device as claimed in claim 1, wherein the dielectric layer comprises at least one polyimide film.

5. The electronic device as claimed in claim 1, wherein the dielectric layer comprises a respective recess overlapping a corresponding one of the plurality of patches.

6. The electronic device as claimed in claim 1, wherein the dielectric layer is a multilayer structure.

\* \* \* \* \*